United States Patent [19]

Katzmann

[11] Patent Number: 4,695,793
[45] Date of Patent: Sep. 22, 1987

[54] RESISTIVE SENSING THERMAL DEVICE FOR CURRENT MEASUREMENT

[75] Inventor: Fred L. Katzmann, Cedar Grove, N.Y.

[73] Assignee: Ballantine Laboratories, Inc., Boonton, N.J.

[21] Appl. No.: 580,450

[22] Filed: Feb. 15, 1984

[51] Int. Cl.⁴ .................. G01R 5/26; G08B 21/00; H01C 7/10
[52] U.S. Cl. .................. 324/106; 340/664; 338/22 R
[58] Field of Search .............. 324/106, 95; 338/22, 338/23, 25, 24; 307/90, 89; 374/183, 185; 329/202; 332/4; 363/13, 178; 361/103; 364/483; 340/664

[56] References Cited

U.S. PATENT DOCUMENTS

| | | | |
|---|---|---|---|
| 1,862,014 | 6/1932 | Grondahl | 338/24 |
| 2,031,480 | 2/1936 | Hamada | 338/24 |
| 2,178,548 | 11/1939 | Black et al. | 338/24 |
| 2,413,021 | 12/1946 | Wolfson et al. | 338/22 R |
| 2,463,805 | 3/1949 | Polye et al. | 338/24 |
| 2,496,541 | 2/1950 | Johnson, Jr. | 324/106 |
| 2,545,390 | 3/1951 | Spahn | 338/24 |
| 2,559,394 | 7/1951 | Brady et al. | 338/63 |
| 2,736,884 | 2/1954 | Yeomans | 340/664 |

FOREIGN PATENT DOCUMENTS

| 113784 | 8/1941 | Australia. | |
| 0204837 | 11/1956 | Australia | 338/24 |

Primary Examiner—Reinhard J. Eisenzopf
Assistant Examiner—Vinh P. Nguyen
Attorney, Agent, or Firm—Davis Hoxie Faithfull & Hapgood

[57] ABSTRACT

A thermal transfer device for use in the measurement of alternating current comprising an evacuated enclosure containing a first electrical conductor heated by the alternating current being measured and a thermal sensor to provide an electrical signal representative of the temperature of the conductor, wherein the first electrical conductor is formed of a low temperature coefficient of resistivity material, and the thermal sensor is a second electrical conductor of a relatively high temperature coefficient of resistivity material thermally coupled with and encompassing most of the first electrical conductor.

15 Claims, 7 Drawing Figures

RESISTIVE SENSING THERMAL DEVICE FOR CURRENT MEASUREMENT

BACKGROUND

Heretofore, the best technique for measurement of alternating current over a wide range of frequencies has been by heating a wire with the alternating current to be measured, using a thermocouple to determine the temperature of the heater wire, and experimentally determining the direct current necessary to produce the same temperature as measured by the same thermocouple. A thermocouple is a pair of junctions of two dissimilar metals, which produces a voltage or electromotive force (emf) dependent upon the relative temperatures of the junctions.

In particular, the most accurate such prior art devices have employed a heater wire and a thermocouple junction enclosed in a vacuum or partial vacuum, with the thermocouple junction thermally contacting (but electrically insulated from) the center of the heater wire. The current in the thermocouple circuit, caused by the unknown alternating current in the heater wire, is determined using a galvanometer. Then, a known quantity of direct current is applied to the heater wire and that current is adjusted until the galvanometer indicates the same temperature has been stabily attained. For reasons of greater accuracy, which are explained below, the direct current step is performed twice; once with the current flowing in each direction through the heater wire. The two direct current measurements are then averaged to produce the rms value of the unknown alternating current.

The fact that a circuit of two different metals, with one of two junctions at a different temperature from the other, will produce a voltage is known as the thermoelectric effect or Seebeck effect, after the German physicist Thomas J. Seebeck. The inverse of the Seebeck effect is the Peltier effect, discovered by the French physicist Jean C. A. Peltier. He discovered that when a current is established in a circuit of two different metals in series, one junction between the two metals will be heated and the other will be cooled. The effect of particular junction heating or cooling depends upon the direction of the current. The extent of heating or cooling energy for a given current depends upon the metals used. An analysis of these effects by the British physicist, William Thompson, later Lord Kelvin, lead to the prediction that a voltage must exist between different parts of the same metal if they are at different temperatures. He demonstrated that, in most metals, if a uniform metal bar is heated at the middle and a current sent from end to end from an external source, the heat would be conducted unequally along the two halves. In a copper bar, for example, the end where the current passes from a colder to a hotter part will be cooler than if no current were applied, and the end where the current passes from a hotter to a cooler part will be warmer than if no current were applied.

The Seebeck or thermoelectric effect is employed in the measuring devices of the prior art described at the outset, in order to produce an electric current representative of the heating effect of the unknown alternating current upon the heater wire. Unfortunately, however, the other two effects mentioned above also affect those devices. In such prior art devices, the heater wire is a relatively high resistance wire, such as a Nickel Chromium alloy, which is connected to leads of a relatively low resistance, such as Dumet. The junctions between the heater wire and its connecting leads are subject to the Peltier effect, meaning that one end of the heater wire is heated and the other end is cooled by the flow of direct current through the wire. (A symmetric alternating current would cancel its own Peltier effect). The adverse effects of the Peltier effect have been reduced in the design of such devices by centering of the thermocouple on the heater wire. Although centering of the thermocouple junction reduces the adverse influence of the Peltier effect at either end of the heater wire, the thermocouple junction is seldom located sufficiently accurately to eliminate all such influence. A high temperature coefficient of resistivity wire is often used for the heater wire in such devices, because it tends to compensate for centering error.

Even if the thermocouple junction were perfectly centered on the heater wire between its connecting leads, however, it would be in the wrong place for elimination of the Thompson effect, as the thermal center for cancellation of the net adverse influence of the Peltier and Thompson effects is not the geometric center of the heater wire. For this reason, the known direct current used for comparison is applied in both directions in making the most accurate measurements with these devices. (Alternating current is not conventionally used for comparison in high accuracy testing because AC standards are not as accurate as DC standards). The additional time required for two direct current measurements makes this AC to DC transfer technique cumbersome, a matter which becomes particularly significant when the techniques are applied to automated measurement equipment. The time delay between measurements also permits introduction of further error, due to changes in ambient temperature.

Further background formation regarding thermocouples in electrical measurement will be found in F. W. Sears & M. W. Zemansky, University Physics, pp. 258-259, 546-553 (2nd Ed. 1955); F. E. Terman, Radio Engineer's Handbook, pp. 926-929 (3rd Ed. 1943); and E. Hausmann & E. P. Slack, Physics, pp. 489-493 (2nd Ed. 1939). In the U.S. patent literature, more background information can be found in Pat. Nos. 3,689,824 (Malcolm), 3,668,521 (Aslan), 3,609,541 (Scott), 3,597,685 (Ford), 3,512,086 (Uiga), 3,267,376 (Harries), and 2,365,207 (Moles).

BRIEF SUMMARY OF THE INVENTION

The present invention consists of improvements in thermal devices for the measurement of alternating current comprising an evacuated enclosure containing a first electrical conductor heated by the alternating current to be measured and a thermal sensor to provide an electrical signal representative of the temperature of the conductor, the improvements involving resistance temperature detection means instead of the thermocouple generally used in the past. In the preferred embodiments, the first electrical conductor is formed of a low temperature coefficient of resistivity material, and the thermal sensor comprises a second conductor of a relatively high temperature coefficient of resistivity material in thermal contact with most of the first conductor. Typically, the first electrical conductor is a first wire and the second electrical conductor is a second wire wrapped about and electrically insulated from the first wire. The current flowing in the first, heater wire is determined by measuring the resistance of the second wire. For the most accurate measurements, comparisons with the heating effects of known currents can be employed.

A thermal device made in accordance with the present invention is useful over a wider current measurement range than the prior art devices described in the Background section above, which I believe also provides advantages in overcoming some of the adverse aspects of the Peltier and Thompson effects.

DETAILED DESCRIPTION

Figure 1:
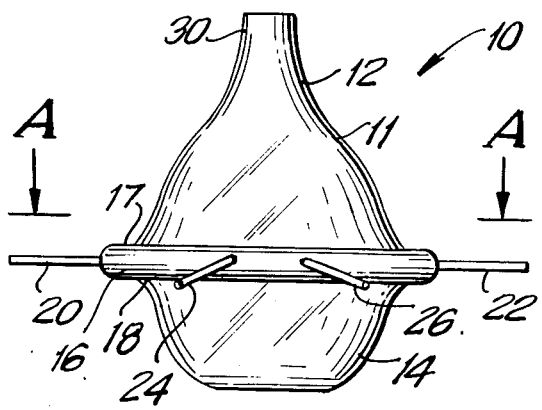
FIG. 1 is a side view outline of a typical vacuum enclosure of the type employed both for the thermal devices of the present invention and those of the prior art.

FIG. 1 is a side view of a conventional, UHF pattern glass vacuum enclosure 11 of a type used both for the thermal devices of the present invention and those of the prior art. The top section 12 has a funnel-like shape and the bottom section 14 has a hat-like shape. The sections 12, 14 are joined by melting in conventional fashion to form a seal 16 along their edges. Lead wires 20, 22, 24, 26 pass through the seal 16 between edges 16, 18 to connect to the components within the enclosure 11. The top section 12 terminates in the tubulation 30 through which the enclosure 11 is exhausted and which is then sealed by melting in the conventional fashion. Other conventional vacuum enclosures may be used for the present invention, but the UHF pattern is preferred for high frequency applications.

Figure 2:
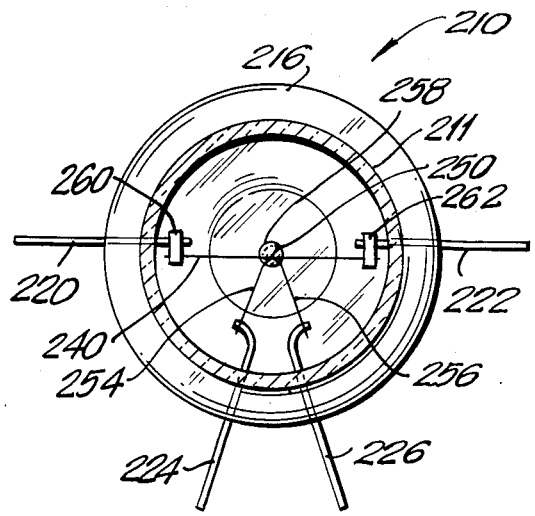
FIG. 2 is a section at A—A of FIG. 1 in a typical thermocouple type thermal device of the prior art.

FIG. 2 is a sectional view at A—A of FIG. 1 in a typical thermocouple type thermal transfer device 210 of the prior art in an enclosure 211. (Here, as elsewhere throughout this specification, where the last two digits are among those used in FIG. 1, the components correspond generally to those so identified in FIG. 1). The heater wire 240 is sometimes connected between leads 220 and 222 (commonly made of Dumet) of the device 210 by intermediate leads 260, 262 which are usually made of platinum or another material chosen for ease of welding to the heater wire 240. A thermocouple junction 250, consisting of two wires of different metals 254, 256 welded together, is attached to the middle of the heater wire 240 by an electrically insulating, thermally conducting adhesive 258. The two thermocouple wires are 254, 256 are welded to leads 224, 226, respectively. The operation of this device 210 is as described in the Background above.

Figure 3:
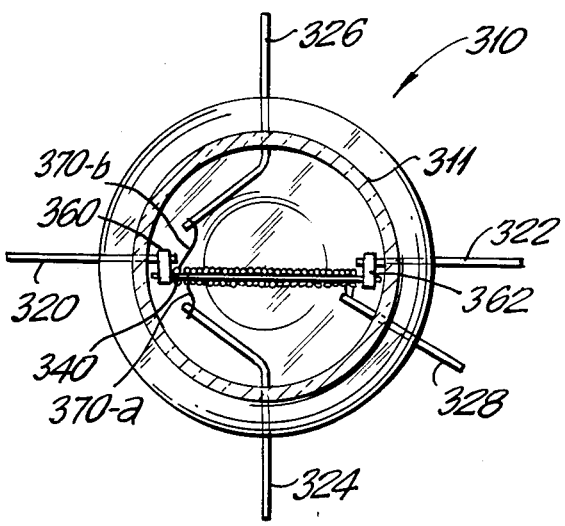
FIG. 3 is a section at A—A of FIG. 1 in a first embodiment of the resistive sensing thermal device of the present invention.

FIG. 3 is a sectional view at A—A of FIG. 1 in a first embodiment of the resistive sensing thermal device of the present invention. A heater wire 340 is connected between leads 320 and 322 of the device 310 by intermediate leads 360 and 362, which will be described further below.

The heater wire 340 has a low temperature coefficient of resistivity, on the order of 10 ppm/° C. or less. In devices for use in a current range of approximately 1–10 mA, I have used 0.0005 inch diameter Stablohm brand, type H-ML insulated wire made by California Fine Wire Company, Grover City, CA, having a temperature coefficient rating of +1ppm/° C. and a resistance of 3192 ohms/foot. This provides a 90 ohm resistance for a 8.6 mm heater length, or a 220 ohms/volt characteristic sensitivity at the nominal 5 mA working current of the device. (Of course, devices of other nominal current rating can be made in accordance with my invention). Another suitable material for the heater wire 240 is Stablohm 800, having a temperature coefficient rating of +5 ppm/° C. Care should be taken in the sealing of the enclosure 311 of these devices to avoid excess heating and contamination of the wires, as that would adversely affect the temperature coefficient which is dependent upon both composition and annealing of the wires.

This device 310, unlike the prior art devices described above, does not employ a thermocouple type temperature sensor, nor is the temperature sensor located solely at the center of the heater wire. Instead, a fine insulated sensing wire 370 having a relatively high temperature coefficient of resistivity is wrapped around the heater wire 340, preferably for most of the heater wire's length. Devices have been made in accordance with this embodiment in which the sensing wire 370 was 0.0005 inch diameter Nickel 272 wire made by California Fine Wire Company, having a temperature coefficient of +6536 ppm/° C. and a resistance of 188 ohms per foot. Other materials useable as the sensing wire are platinum and high purity nickel.

The use of low temperature coefficient of resistivity material for the heater wire 340 in accordance with my invention provides a more nearly linear relationship between the current being measured and the temperature of the wire, because the resistance of the wire changes only a small amount with temperature. The use of a high temperature coefficient of resistivity material for the thermal sensor wire 370 in accordance with my invention provides a relatively large change in its resistance for a small change in temperature of the heater wire 340, thereby providing relatively great sensitivity for measurements based upon this change in resistance. The wrapping of the sensing wire 370 about most of the length of the heater wire 340 minimizes the problems of centering error and may also tend to reduce the adverse influence of the Thompson effect.

Figure 4:
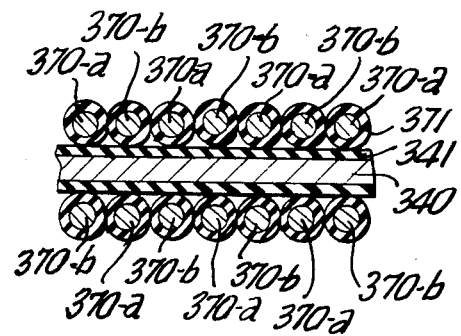
FIG. 4 is a detailed schematic cross-section along the axis of the heater wire of FIG. 3, showing the heater wire and the sensing wire wrapped around it.

In order to reduce the adverse effects of induced currents in the sensing wire 370, it should be wound in a bucking configuration, with half of the sensing wire 370 wound in one direction about the heater wire 340 and the other half of the sensing wire wound in the opposite direction. This will cause the currents in the sensing wire 370 which are induced by the current in the heater wire 340 to cancel out. One way of accomplishing this is to wind the sensing wire 370 about the heater wire 340 by first forming the sensing wire into a hairpin shape, holding the "U" of the sensing wire 370 at the center of the heater wire 340, and then wrapping both ends of sensing wire 370 about the heater wire 340 in the same direction for the same number of turns. The result of thus winding the sensing wire 370 is that the windings in one half are in the opposite direction to those in the other half. Alternatively, a bucking configuration can be obtained by bifilar winding, as shown in FIGS. 3 and 4. This is done, for example, by winding two adjacent wires 370-a, 370-b and joining them at one end. Although in experimental devices, each of these wires 370-a, 370-b was separately connected at both ends to lead wires and the lead wires at one of those ends were connected externally to achieve a bifilar winding, I prefer to join the the two parts 370-a and 370-b of the sensing wire to a single supporting wire 328 inside the enclosure 311 as shown in FIG. 3, or to join them without a support lead, or to form sensing wire 370 from a single length of wire in the shape of a hairpin before wrapping it around the heater wire 340.

The sensing wire 370 must be thermally well coupled to the heater wire 340, but electrically insulated from both the heater wire 340 and adjacent turns of the sensing wire 370. (It is contemplated that one point on the heater wire or heater wire lead may be connected to a corresponding point on the sensing wire or sensing wire lead, for example to share a lead wire. If, however, more than one point were so connected, most of the current between those points would bypass the relatively high resistance heater wire through the low resistance sensing wire, rendering the intervening portion of the heater wire inoperable as a heater). Although insulation on the sensing wire 370 alone should suffice to serve this purpose, because of the possibility of cracks in the insulation of the tightly wrapped sensing wire, I have to date used a high temperature insulating coating 341, 371 on both the heater wire 340 and the sensing wire 370, respectively. The insulating coating I have used is DuPont PYR-ML. Alternatively, a suitable ceramic coating may be used.

The alternating current to be measured flows through the heater wire 340. At relatively low heater wire 340 currents and with the heater wire in air, the temperature of the heater wire 340 has been experimentally measured as rising in proportion to the square of the current. As the wire temperature rises, conduction through the air would play an increasing role, with the result that the current/temperature characteristic would depart from the square law response. By placing the heater wire 340 and sensing wire 370 in the evacuated enclosure 311, the air conduction effects are greatly reduced. As a result, there is a much greater conformity between temperature and the square of the heater current over a ten-to-one range of current through the heater wire 340.

The intermediate leads 362 and 364 are also an improvement. In accordance with my preferred embodiments, they are made of the same material or substantially the same material, insofar as Peltier characteristics are concerned, as the heater wire 340. As a result, there is no significant Peltier effect at the junctions between the heater 340 and the intermediate leads 360 and 362. In addition, the intermediate leads are relatively massive, as compared with the very fine heater wire. Thus, they function as a heat sink isolating the heater wire 340 from the Peltier effect which does occur where the intermediate leads 360, 362 join the leads 320, 322. As a result, there is less adverse Peltier effect on the heater wire 340.

Figure 5:
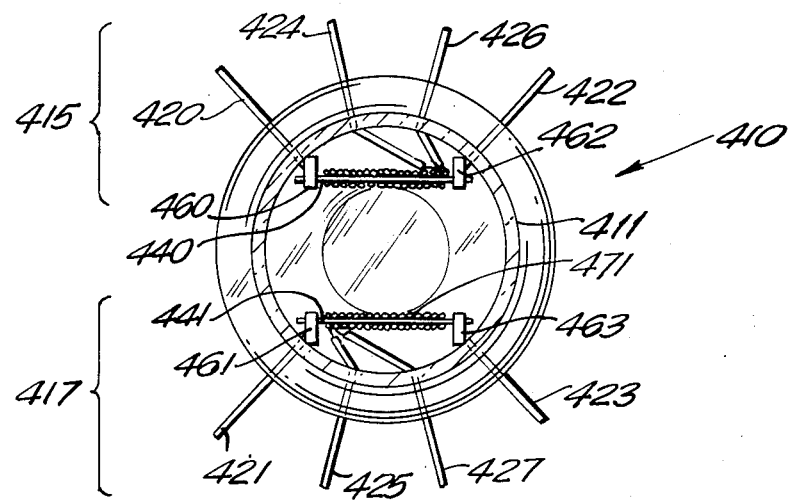
FIG. 5 is a section at A—A of FIG. 1 in a second embodiment of the resistive sensing thermal device of the present invention.

A second embodiment of my invention, device 410, is shown in FIG. 5. It comprises two heater wires 440 and 441, each similar to the heater wire 340 of the embodiment of FIG. 3, within an enclosure 411. At least one of these heater wires 440 is part of a first thermal element 415 of the same type as the thermal element of device 310 in FIG. 3, with corresponding components. Intermediate leads 460, 462 of the same type as leads 360, 362 of FIG. 3 can be employed in the first thermal element 415 for the reasons discussed in connection with FIGS. 2 & 3.

A second thermal element 417, including a second heater wire 441, is provided within the enclosure 411 for use as a standard, subjected to substantially the same environmental conditions as the thermal element 415. The second heater wire 441 is supported by leads 421, 423 and intermediate leads 461, 463, and spaced sufficiently from the first thermal element 415 so that there is no significant adverse interaction. I prefer to make the second thermal element 417 substantially the same as the first thermal element 415, so that the mass of the second thermal element 417 and its characteristics are very similar to those of the first thermal element 415.

The second thermal element may be for either "hot" or "cold" use. For "hot" operation, a standard current is passed through the heater wire 441. For "cold" operation, the heater wire 441 is merely a support for the sensing wire 471.

Figure 6:
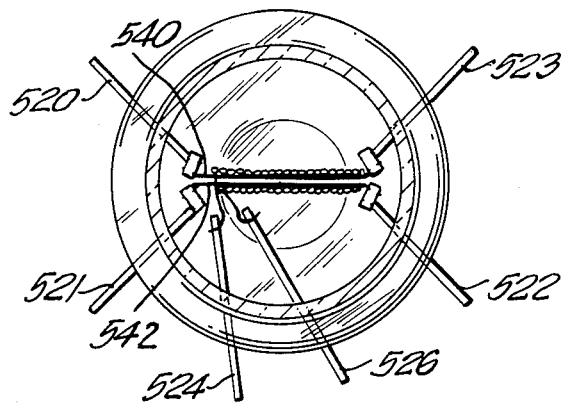
FIG. 6 is a section at A—A of FIG. 1 in a third embodiment of the resistive sensing thermal device of the present invention.
Figure 7:
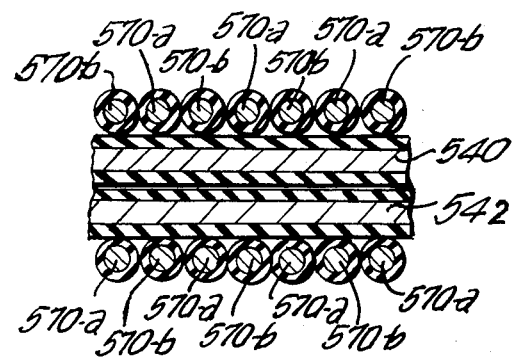
FIG. 7 is a detailed schematic cross-section along the axis of the heater wire of FIG. 6, showing the heater wires and the sensing wire wrapped around them.

Device 510, shown in FIGS. 6 and 7, is a third embodiment of my invention. In this embodiment, two heater wires 540 and 542 are provided in close proximity to each other and each is thermally coupled to a single sensing wire, as shown in the figures. Each of the heater wires 540, 542 is connected by its respective intermediate leads and its respective leads 520, 522 and 521, 523. The sensing wire is connected to leads 524 and 526. It may also have a support lead similar to support 328 of FIG. 3. The heater and sensing wires are electrically insulated from each other; however, two or more may have a common point, for example, to employ a common lead.

This device 510 permits an equal temperature measurement technique without switching of the connections to the heater wires. In accordance with one version of this technique, one of the heater wires, for example, wire 540, is connected to the source of the unknown current. The other heater wire, wire 542 in this example, is connected to a calibrated source of current. After application of the unknown current to heater wire 540, the calibrated current supplied to heater wire 542 is adjusted so that the resistance of the sensing wire 571 is a predetermined value, indicating that the average temperature sensed is at a fixed reference point. The calibrated current necessary to bring the sensing wire 571 resistance to that value is indicative of the unknown current.

I claim:

1. In a thermal transfer device for use in the precise measurement of electrical current including an evacuated enclosure containing a first elongate electrical conductor, which conductor is heated by the electrical current being measured, and a thermal sensor that provides an electrical characteristic representative of the temperature of the first electrical conductor, the improvement comprising:

(a) the first electrical conductor being a fine wire formed of a low temperature coefficient of resistivity material;

(b) the thermal sensor being a second elongate fine wire electrical conductor formed of a relatively high temperature coefficient of resistivity material; and (c) the length of the thermal sensor being thermally coupled with most of the length of the first electrical conductor.

2. The improvement of claim 1 wherein the first electrical conductor is a first wire, the second electrical conductor is a second wire wrapped about the first wire.

3. The improvement of claim 2 wherein the first and second wires are electrically insulated from one another.

4. The improvement of claim 3 wherein the first and second wires are both coated with a high temperature electrical insulation.

5. The improvement of any one of claims 1 through 4 wherein the first electrical conductor has a temperature coefficient of resistivity of less than approximately 5 parts per million per degree Celsius.

6. The improvement of claim 5 wherein the second electrical conductor has a temperature coefficient of resistivity of greater than approximately 5000 parts per million per degree Celsius.

7. The improvement of any one of claims 1 through 4 wherein the second electrical conductor has a temperature coefficient of resistivity of greater than approximately 5000 parts per million per degree Celsius.

8. The improvement of any one of claims 2 through 4 wherein the second electrical conductor is a wire is wound in a bucking configuration around the first electrical conductor.

9. The improvement of claim 8 wherein the half of the second electrical conductor at one end is wound in the opposite direction from the half at the other end.

10. The improvement of claim 8 wherein the second electrical conductor is bifilarly wound around the first electrical conductor.

11. The improvement of claim 8 wherein the first electrical conductor has a temperature coefficient of resistivity of less than approximately 5 parts per million per degree Celsius.

12. The improvement of claim 11 wherein the second electrical conductor has a temperature coefficient of resistivity of greater than approximately 5000 parts per million per degree Celsius.

13. The improvement of claim 8 wherein the second electrical conductor has a temperature coefficient of resistivity of greater than approximately 5000 parts per million per degree Celsius.

14. The improvement of any one of claims 1 through 4 further comprising primary leads for electrical connections to said electrical conductors from outside the enclosure and intermediate leads connecting the first electrical conductor to the primary leads, said intermediate leads each having substantially the same Peltier effect material characteristics as the first electrical conductor and a greater mass than the first electrical conductor.

15. The improvement of claim 14 wherein the second electrical conductor is a wire wound in a bucking configuration around the first electrical conductor.

* * * * *